(12) United States Patent
Rivkin et al.

(10) Patent No.: US 6,270,582 B1
(45) Date of Patent: *Aug. 7, 2001

(54) SINGLE WAFER LOAD LOCK CHAMBER FOR PRE-PROCESSING AND POST-PROCESSING WAFERS IN A VACUUM PROCESSING SYSTEM

(75) Inventors: Michael Rivkin, Mountain View; Ed Kaczorowski, Saratoga, both of CA (US)

(73) Assignee: Applied Materials, Inc, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/990,396

(22) Filed: Dec. 15, 1997

(51) Int. Cl.$^7$ .................................................. C23C 16/54
(52) U.S. Cl. ..................... 118/719; 414/217; 414/935; 414/936; 414/937; 414/939
(58) Field of Search .................... 414/217, 935, 414/936, 937, 939; 118/719

(56) References Cited

U.S. PATENT DOCUMENTS

| | | | |
|---|---|---|---|
| 4,512,391 | 4/1985 | Harra . | |
| 5,421,889 | * 6/1995 | Pollock et al. | 118/719 |
| 5,607,009 | 3/1997 | Turner et al. | 165/48.1 |
| 5,609,689 | * 3/1997 | Kato et al. | 118/719 |
| 5,695,568 | * 12/1997 | Sinha et al. | 118/729 |
| 5,951,770 | * 9/1999 | Perlov et al. | 118/719 |

OTHER PUBLICATIONS

PCT International Search Report dated Apr. 14, 1999.

* cited by examiner

*Primary Examiner*—Elizabeth M. Cole
*Assistant Examiner*—John J. Guamello
(74) *Attorney, Agent, or Firm*—Thomason, Moser & Patterson LLP.

(57) ABSTRACT

A vacuum processing system has a load lock chamber for transitioning wafers between an ambient environment pressure and a transfer chamber vacuum pressure. The load lock chamber has wafer supports for two wafers, but contains only one wafer during pressure transitioning. The load lock chamber further has a processing element, so that the load lock chamber performs a pre-processing or post-processing process on the wafer. The processing element may be a wafer heater, so that the load lock chamber may heat the wafer before or after the system performs a primary process on the wafer. The processing element may be a wafer cooler, so that the load lock chamber may cool down a wafer that has been heated before, during or after the primary process. The load lock chamber may have either a wafer heater or a wafer cooler or both.

40 Claims, 4 Drawing Sheets

SINGLE WAFER LOAD LOCK CHAMBER FOR PRE-PROCESSING AND POST-PROCESSING WAFERS IN A VACUUM PROCESSING SYSTEM

FIELD OF THE INVENTION

The present invention generally relates to the storage and transfer of wafers typically used in the fabrication of integrated circuits and flat panel displays. Specifically, the invention relates to a load lock chamber used to transition wafers from an ambient environment to a vacuum environment in a processing system and methods and apparatuses for pre-processing and post-processing the wafers before or after a primary process is performed on the wafer.

BACKGROUND OF THE INVENTION

Vacuum processing systems for processing 100 mm, 200 mm, 300 mm or other diameter wafers are generally known. An example of a typical vacuum processing system 10 is shown in FIG. 1a. The system 10 typically has a centralized transfer chamber 12 mounted on a monolith platform (not shown). The transfer chamber 12 is the center of activity for the movement of wafers being processed in the system. One or more process chambers 14 attach to the transfer chamber 12 at valves through which the wafers are passed by a robot 16 in the transfer chamber 12. The valves are selectively opened and closed to isolate the process chambers 14 from the transfer chamber 12 while wafers are being processed in the process chamber 14. Physically, the process chambers 14 are either supported by the transfer chamber 12 and its platform or are supported on their own platform. Inside the system 10, the transfer chamber 12 is typically held at a constant vacuum; whereas, the process chambers 14 may be pumped to a greater vacuum for performing their respective processes. Afterward, the chamber pressure must be returned to the level in the transfer chamber 12 before opening the valve to permit access between the chambers.

Access to the transfer chamber for wafers from the exterior of the system, or from the manufacturing facility, is typically through one or more load lock chambers. The load lock chambers cycle between the pressure level of the ambient environment and the pressure level in the transfer chamber in order for the wafers to be passed therebetween, so the load lock chambers transition the wafers between the atmospheric pressure of a very clean environment to the vacuum of the transfer chamber. Load lock chambers typically have a large volume holding several wafers, from about thirteen to about twenty five wafers. The wafers are stacked vertically in a wafer cassette with a space between each wafer permitting a robot blade to reach under a wafer to remove the wafer. Thus, a fairly large volume is being transitioned between the atmospheric pressure and the vacuum pressure, which takes about four minutes. During the time to perform this transition, no process is being performed on the wafers.

The load lock chambers may open to the ambient environment for an operator to load a wafer cassette, or pod, thereinto or the load lock chambers may attach to a mini-environment which transfers wafers in a very clean environment at atmospheric pressure from wafer pods to the load lock chambers. The mini-environment also has a wafer orienter or aligner for aligning the wafer so that the wafer is properly oriented in the load lock chamber.

Some common transfer chambers have four to six facets to mount process chambers and load lock chambers. For a six-faceted transfer chamber, typically two of the facets are designated for load lock chambers, and the other four facets are designated for process chambers. The process chambers include rapid thermal processing (RTP) chambers, physical vapor deposition (PVD) chambers, chemical vapor deposition (CVD) chambers, etch chambers, etc. The productivity of a vacuum processing system is increased when more process chambers are mounted to the transfer chamber because more wafers can be processed at a given time. Additionally, less space is required in the manufacturing facility to process a certain number of wafers if the productivity of the system is maximized.

Some of the processes performed by the process chambers require that the wafers processed therein be pre-processed or post-processed before or after performing the primary process in a process chamber. For example, a process may require that a wafer be pre-heated before performance of the primary process, thus preparing the wafer for the primary process, so that the primary process proceeds more quickly or efficiently. In a second example, a process may require that a wafer be heated after performance of the process, such as a spin-on-glass process that coats the wafer with a liquid glass material that must be cured following deposition by heat-treating the wafer at elevated temperatures. In yet another example, a process may require that a wafer be cooled after performance of the process, so that the wafer is not too hot to handle or so that the wafer is not so hot that dopants or other material in or on the wafer diffuse through the wafer thereby compromising the integrity of the devices formed in or on the wafer.

For such processes, the vacuum processing system typically provides a processing element, such as a wafer heater or wafer cooler, in a location separate from the process chamber to perform the pre-processing or post-processing process on the wafer, so that the wafer spends as little time as possible inside the process chamber, and so that the process chamber does not have to incorporate the extra equipment required to perform these extra processing steps. For example, in the vacuum processing system 100 shown in FIG. 1, and described more fully in the detailed description of a preferred embodiment below, the transfer chamber 102 has four facets 106 for mounting process chambers 104 and two facets 112 for mounting load lock chambers 108. One or more of the facets 106 of the system, however, mount a pre-processing or post-processing chamber such as a cool-down chamber to cool a wafer after a process and/or a heating chamber to heat the wafer before or after a process. This separation of functions permits the system to perform tasks in parallel, so while a wafer is undergoing the pre-processing or post-processing step, another wafer is undergoing the primary processing step. However, the total throughput of the system 100 is reduced since the system 100 has fewer process chambers 104 for performing the primary processing of the wafers.

In order to perform the pre-processing or post-processing processes, the vacuum system 100 maneuvers a wafer through a series of steps prior to transferring the wafer to a process chamber 104 for performance of the primary process. Typically, these steps are performed by the transfer chamber 102 and an attached pre-processing or post-processing chamber. For example, after a load lock chamber 108 transitions a cassette of wafers to the vacuum level of the transfer chamber 102, a robot in the transfer chamber 102 moves the wafers, one at a time, to a process chamber 104 or a pre-processing chamber. After a wafer has been pre-processed, such as heated to an appropriate temperature, the robot moves the wafer to one of the process chambers 104 for primary processing. After the process chamber 104 completes its process on the wafer, the robot moves the wafer back to a load lock chamber 108 or to a post-processing chamber, such as a cool-down chamber. After the wafer has been post-processed, the robot moves the wafer to the load lock chamber 108. After all of the wafers in the cassette have been processed, the load lock chamber 108 transitions the wafers back to the ambient environment pressure level. The steps to move the wafers to and from the pre-processing and post-processing chambers add to the overall time required for processing a wafer through the vacuum processing system. The cost to manufacture an integrated circuit is typically directly related to the amount of time required to process the wafer; therefore, since a certain amount of time is required to perform the pre- and post-processing steps and to transition the load lock chamber, as discussed above, it is desirable to compress this time as much as possible.

Additionally, since an extra pre-processing or post-processing chamber occupies one of the locations on the transfer chamber that could be occupied by a process chamber, the productivity potential, or throughput, of the vacuum processing system is decreased. Therefore, in order for a manufacturing facility to achieve the same throughput as would be achieved if each system had the maximum number of process chambers and no extra chambers, the manufacturing facility would have to increase the number of systems in the facility, which translates to an increase in the amount of floor space dedicated to these systems. Thus, the manufacturing costs increase.

A need, therefore, exists for a vacuum processing system that uses the waiting time during the pressure transition in the load lock chambers to be more productive, reduces the time required for an individual wafer to be processed and decreases the amount of space required for the manufacturing facility.

SUMMARY OF THE INVENTION

A vacuum processing system has a load lock chamber that transitions one wafer at a time between two pressure levels, such as the ambient environment pressure level and the transfer chamber vacuum pressure level. The load lock chamber has two wafer support apparatuses for holding two wafers, so that with only one wafer being transitioned in one direction, the robot always has a place to put a wafer going in the opposite direction before removing the other wafer. Also, with only a single wafer in the load lock chamber, it is possible to perform a process on the wafer while the pressure is transitioning. Thus, the load lock chamber performs in parallel some steps that had previously been done in series. For example, a load lock chamber may be equipped with a wafer heater, so that the wafer may be heated while the load lock chamber is performing the pressure transition. Likewise, a load lock chamber may be equipped with a wafer cooler, so that the wafer may be cooled during the pressure transition. Alternatively, the load lock chamber may have both a wafer heater and a wafer cooler, so that a wafer can be pre-heated on its way to the process chamber and cooled on its return in the same load lock chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

Figure 1:
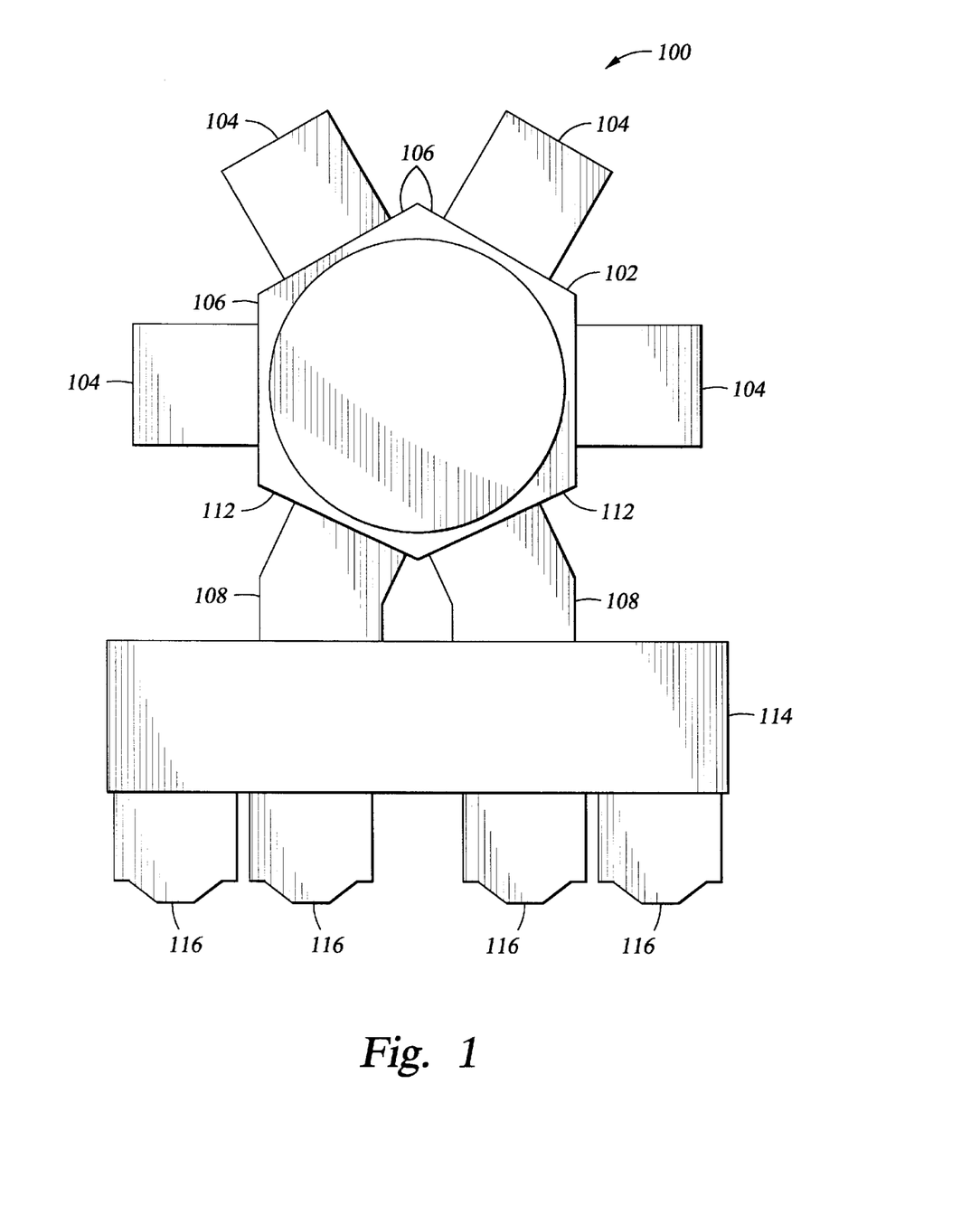
FIG. 1 is a top schematic view of a vacuum processing system.

FIG. 1 generally shows a schematic top view of a vacuum processing system 100 incorporating the present invention. The vacuum processing system 100 includes a transfer chamber 102 typically mounted on a platform (not shown). The transfer chamber 102 has two load lock chambers 108 mounted at facets 112. The load lock chambers 108 transition one wafer at a time between the ambient environment pressure to the transfer chamber vacuum pressure. Since the load lock chambers 108 only hold one wafer during the pressure transition, the load lock chambers 108 are very small compared to previous load lock chambers, and the pressure transition is much faster. The load lock chambers 108 contain a wafer support apparatus with two wafer supports so that a robot may place a wafer on one of the supports and then remove another wafer from the other support, leaving only one wafer in the load lock chamber 108 during the pressure transition. The load lock chambers 108 also have a wafer processing element for performing a process, such as heating or cooling, on the wafer before or after the wafer undergoes the primary process of the vacuum system 100. A vacuum processing chamber 100 having a load lock chamber 108 as described herein has a processing throughput between about 100 and about 120 wafers per hour. Whereas, a vacuum processing system having a multi-wafer load lock chamber, capable of storing 25 wafers, may have a throughput of only about 80 wafers per hour.

Openings (not shown) in facets 112 provide access and valves provide isolation between the load lock chambers 108 and the transfer chamber 102. Correspondingly, the load lock chambers 108 have openings on their surfaces that align with the openings in facets 112. The load lock chambers 108 are attached to mini-environment 114. The load lock chambers 108 and the mini-environment 114 have corresponding openings (not shown) providing access therebetween, while doors (not shown) for the openings provide isolation.

The transfer chamber 102 has process chambers 104 attached at facets 106. The process chambers 104 perform the primary wafer process on the wafers in the vacuum processing system 100; whereas, the load lock chambers 108 optionally perform a pre-processing or post-processing wafer process on the wafers. Process chambers 104 may be any type of process chamber, such as a rapid thermal processing chamber, a physical vapor deposition chamber, a chemical vapor deposition chamber, an etch chamber, etc. It is not uncommon for a manufacturer of process chambers to provide over twenty different types of process chambers. The process chambers 104 may be supported by the transfer chamber 102 or may be supported on their own platforms depending on the configuration of the individual process chambers 104. Slit valves (not shown) in the facets 106 provide access and isolation between the transfer chamber 102 and the process chambers 104. Correspondingly, the process chambers 104 have openings (not shown) on their surfaces that align with the slit valves.

The mini-environment 114 has four pod loaders 116 attached on its front side. Openings (not shown) with corresponding doors (not shown) provide access and isolation between the mini-environment 114 and the pod loaders 116. The pod loaders 116 are mounted on the side of the mini-environment 114 and are essentially shelves for supporting the wafer pods used to transport the wafers to and from the vacuum processing system 100.

In operation, wafer pods, or wafer cassettes, (not shown) containing wafers to be processed in the system 100 are placed on the top of the pod loaders 116. A robot (not shown) then removes a wafer out of the wafer pods and into one of the load lock chambers 108. The pressure in the load lock chamber 108 then reduces to match that in the transfer chamber 102. During this time, the wafer may undergo a pre-processing process, such as pre-heating or cooling. Whether the wafer undergoes a pre-processing process depends on the requirements of the primary process that the system 100 performs on the wafer. For example, in certain applications, the primary process will proceed more quickly or more efficiently if the wafer is heated before the process begins.

After the pressure in the load lock chamber is reduced and the pre-processing is completed, the door on the transfer chamber side opens. Then the transfer chamber robot (not shown) can service the load lock chamber 108. The transfer chamber robot moves the wafer from the load lock chamber 108 to one of the process chambers 104 for processing, and afterwards moves the wafer back to one of the load lock chambers 108. Then the pressure in the load lock chamber is returned to that of the mini-environment During this time, the wafer may undergo a post-processing process, such as heat-treating or cooling. For example, in certain cases, such as a spin on glass process, a thin liquid glass coating must be heat-cured. Alternatively, in certain cases where the wafer is hot after a primary process, the wafer will need to be cooled before transferring the wafer back through the mini-environment 114 to the pod loaders 116. After the pressure in the load lock chamber is increased to the ambient pressure and the post-processing step is completed, the robot within the mini-environment 114 can move the processed wafer back to a wafer pod 116.

Figure 2:
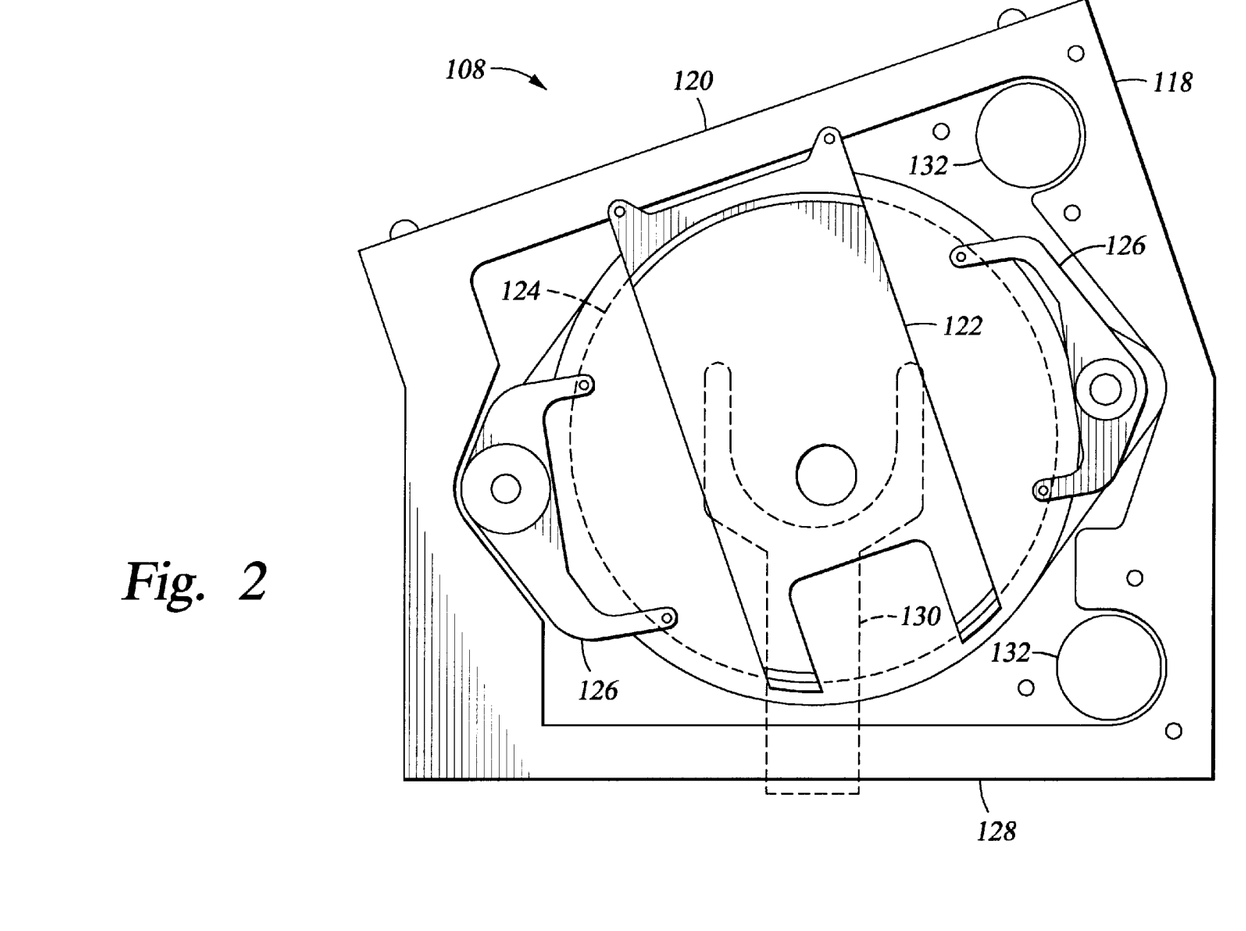
FIG. 2 is a top interior view of a load lock chamber for a vacuum processing system.

FIG. 2 shows an exemplary load lock chamber 108 of the present invention. The load lock chamber 108 has a housing 118 enclosing the chamber. Two vacuum pumping ports 132 provide access to vacuum forelines (not shown) for reducing the pressure in the load lock chamber 108. A side 120 attaches to the transfer chamber 102, and an opening (not shown) in the side 120 permits access by the transfer chamber robot blade 122. The robot arm that attaches to the robot blade 122 is not shown. Another side 128 attaches to the mini-environment 114, and an opening (not shown) in the side 128 permits access from the mini-environment 114. The robot blade 122 inserts a wafer through the opening in the side 120 into the position shown by the wafer 124 in dashed lines. The wafer lift apparatuses 126 lift the wafer 124 off of the robot blade 122 and raise and lower the wafer 124 as necessary for pre-processing or post-processing. A mini-environment robot blade 130, shown in dashed lines, accesses the wafer 124 through the opening in the side 128. The robot blade 130, shown in dashed lines, cannot enter the load lock chamber 108 at the same time as transfer chamber robot blade 122, since a door will have closed the opening in the side 128 when the opening in the opposite side 120 is open.

Figure 3:
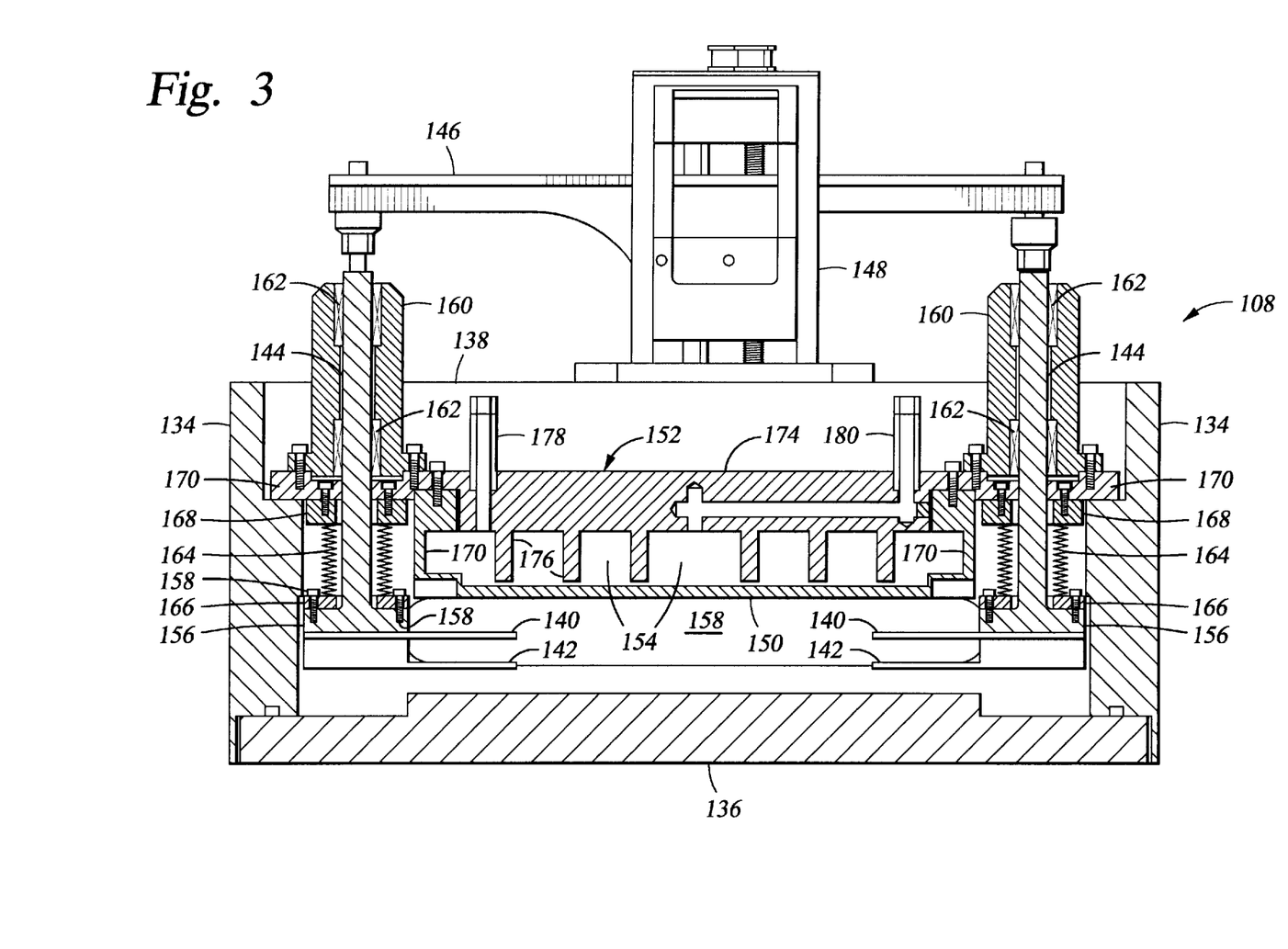
FIG. 3 is a side view of an embodiment of a load lock chamber with a wafer cooler.

FIG. 3 shows a side view of one embodiment of a load lock chamber 108. The housing 118 has side walls 134, a bottom plate 136, or pedestal, and a top plate 138. Two sets of wafer seats 140, 142 form the wafer lift apparatuses 126 for holding the wafers. The wafer seats 140, 142 provide support for the wafers and also raise and lower the wafers in response to the action of a wafer lift apparatus that generally includes two guide rods 144, a tie bar 146 and a lift actuator 148. The wafers are raised by the wafer lift apparatus to a level proximate to a wafer cooler that generally includes a cooling plate 150 and a coolant tank 152 with a plurality of coolant fluid channels 154. The load lock chamber 108 has an opening 158 for providing access for a wafer to enter the load lock chamber 108 and be lifted off a robot blade by one of the sets of wafer seats 140, 142.

The guide rods 144 have flanges 156 attached to the wafer seats 140, 142. The guide rods 144 make slidable contact with the top plate 138 through guide rod access cylinders 160 and bearings 162. A flexible bellows 164 attaches through bottom rings 166 to the guide rod flanges 156 and through top rings 168 to seal plates 170 to form an airtight seal for the guide rods 144 yet permit vertical movement thereof The guide rod access cylinders 160 attach to the seal plates 170, and together the guide rod access cylinders 160 and the seal plates 170 are held fixed in place by the top plate 138 and the side walls 134. The guide rods 144 attach to the ends of the tie bar 146, which attaches to the lift actuator 148. The lift actuator 148 mounts to the top plate 138. The lift actuator 148 raises and lowers the tie bar 146, which raises and lowers the guide rods 144, which translates this vertical motion into the load lock chamber 108 in order to raise and lower the wafer seats 140, 142. The lift actuator 148 is shown as having a gear-activated rotating screw lift mechanism. However, it is to be understood that the lift actuator 148 may be any suitable device for providing lift action, such as an air cylinder with an actuating piston.

The coolant tank 152 includes a coolant tank housing 172 shown integral with the cooling plate 150, which forms the bottom of the coolant tank 152. The coolant tank 152 also has a coolant tank lid 174 with a plurality of channel walls 176 separating the coolant fluid channels 154. Coolant lines 178, 180 provide a coolant fluid inlet and outlet. A coolant fluid, such as chilled water, flows into the coolant tank 152 through one of the coolant lines 178, 180 and circulates through the coolant channels 154. The coolant fluid cools the cooling plate 150 and flows out of the tank 152 through the other one of the coolant lines 178, 180.

In operation, a wafer sits on one of the sets of wafer seats 140, 142 and the other set of wafer seats 140, 142 is empty. The wafer lift apparatus moves the sets of wafer seats 140, 142, so that the empty set of wafer seats aligns with the opening 158 to receive a wafer. With the opening 158 open, a robot blade inserts a wafer into the load lock chamber 108 until the wafer is in a loading position above the empty one of the sets of wafer seats 140, 142. The wafer lift apparatus raises and lifts the wafer off of the robot blade with the wafer seats 140, 142. The robot blade withdraws from the load lock chamber 108. The wafer lift apparatus changes the position of the sets of wafer seats 140, 142, so that the other wafer aligns with the opening 158 so it can be removed by the robot blade. The robot blade reenters the load lock chamber 108 below this wafer. The wafer lift apparatus lowers the wafer onto the robot blade. The robot blade withdraws from the load lock chamber 108 taking the wafer out, too. This general loading and unloading procedure is essentially the same whether the exchange is being made with the transfer chamber 102 or the mini-environment 114.

Since this embodiment of a load lock chamber 108 has a wafer cooler as the only wafer processing element, this load lock chamber 108 can only cool a wafer. A wafer is cooled in the load lock chamber 108 by raising it to a position proximate to the cooling plate 150, about 20 mils, so that heat may radiate from the wafer to the cooling plate 150 for about 30 seconds or more, depending on the initial temperature of the wafer, and then be conducted to the coolant fluid. Additionally, as the pressure in the load lock chamber 108 rises to the ambient environment pressure, then the wafer may also begin to be cooled by convection cooling. Since wafer processes typically do not require a wafer to be cooled prior to performing the process, the wafer cooler is typically used after the performance of the process. Depending on the construction of the wafer cooler and the upper set of wafer seats 140, it may be possible to raise the lower set of wafer seats 142 to a position proximate to the cooling plate 150. However, it is more feasible to construct the sets of wafer seats 140, 142 so that only the upper set of wafer seats 140 may be raised proximate to the cooling plate 150. Therefore, it is preferred to use the upper set of wafer seats 140 for a processed wafer which is being loaded into the load lock chamber 108 from the transfer chamber 102 and which needs to be cooled.

In operation, when the load lock chamber 108 is ready to exchange a wafer with the transfer chamber 102, then the wafer lift apparatus positions the upper set of wafer seats 140 to receive a wafer. After the load lock chamber 108 receives a wafer on the upper set of wafer seats 140 and a wafer on the lower set of wafer seats 142 is removed, then the wafer lift apparatus raises the wafer proximate to the cooling plate 150 while the pressure increases to the ambient environment pressure. Then the load lock chamber 108 will receive a wafer on the lower set of wafer seats 142 from the mini-environment 114 and provide the wafer on the upper set of wafer seats 140 to the mini-environment 114.

Figure 4:
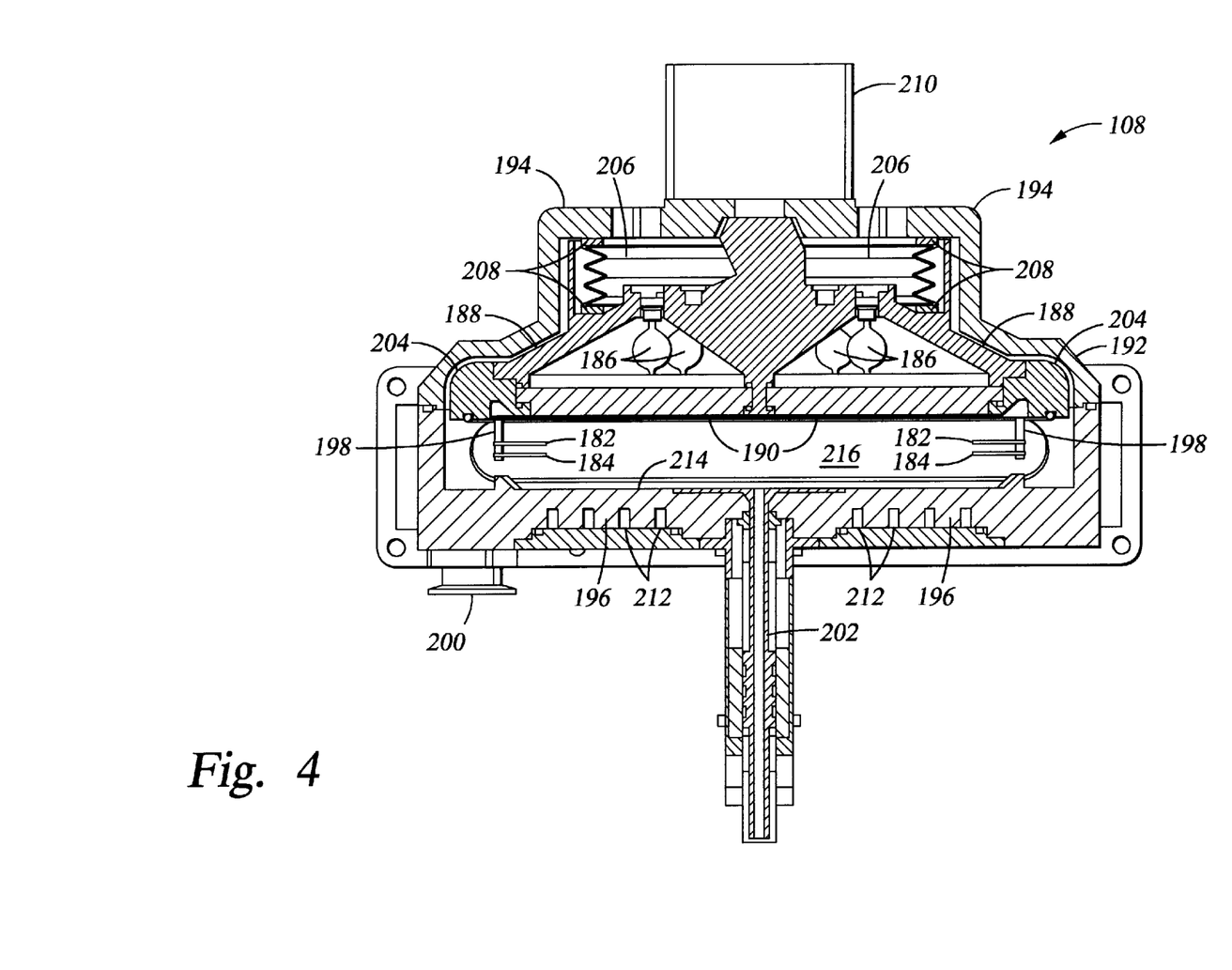
FIG. 4 is a side view of an alternative embodiment of a load lock chamber with a wafer cooler and a wafer heater.

Another embodiment of a load lock chamber 108 is shown in FIG. 4. Generally, the load lock chamber 108 has a sealed housing 192 with a top portion 194 and a bottom portion in 196, or pedestal, and provides a wafer lift apparatus, a wafer heater above the wafer and a wafer cooler below the wafer. Therefore, a wafer that is to be heated before or after undergoing a primary process in a process chamber should be placed on the upper set of wafer seats 182, whereas a wafer that is to be cooled should be placed on the lower set of wafer seats 184.

The wafer heater generally includes infrared (IR) sources 186, a heater housing 188 and quartz windows 190. The IR sources 186 radiate heat from inside the heater housing 188 to a wafer seated on the upper set of wafer seats 182. Additionally, the IR sources 186 are spaced within the heater housing 188, such as in a circular arrangement, to evenly heat as much of the wafer area as possible. The quartz windows 190 typically are 90% transparent to permit the radiation to pass therethrough. The quartz windows 190 also seal the housing 188 to isolate the IR sources 186 from the vacuum in the load lock chamber 108.

The wafer lift apparatus generally includes the wafer heater, the upper and lower sets of wafer seats 182, 184, wafer seat supports 198, a heater housing seal 204, a bellows assembly 206, 208 and a lift mechanism 210. In FIG. 4, the wafer lift apparatus is shown in a raised position. The lift mechanism 210 attaches to the top portion 194 of the load lock chamber 108 and generally includes a lift actuator and motion translation device that perform the same function as the lift actuator 148, tie bar 146 and guide rods 144 of the embodiment shown in FIG. 3, except that the lift mechanism 210 moves the wafer heater as well as the wafer seat supports 198 and the sets of wafer seats 182, 184. The bellows assembly 206, 208 includes a flexible bellows 206 and mounting rings 208. The mounting rings 208 seal the flexible bellows to the top portion 194 above and to the heater housing 188 below to form an airtight flexible seal, so the heater housing 188 may be raised and lowered while maintaining the vacuum in the load lock chamber 108. The vertical motion of the lift actuator translates through the bellows assembly 206, 208 to raise and lower the heater housing 188, which supports the rest of the wafer heater components, the wafer seat supports 198 and the sets of wafer seats 182, 184.

The wafer cooler is built into the load lock chamber bottom portion 196. Coolant fluid channels 212 circulate a coolant fluid, such as chilled water, through the bottom portion 196. The top surface 214 of the bottom portion 196 forms a cooling plate for the wafer cooler. When a wafer is lowered proximate to or touching the top surface 214, then the wafer is cooled by radiating or conducting heat to the top surface 214 where it is conducted to the coolant fluid channels 212. Since the wafer cooler is disposed under the wafer, it is preferable to place the wafer on the lower set of wafer seats 184 for cooling.

The load lock chamber 108 also has a vacuum pumping port 200. The vacuum port 200 attaches to a vacuum foreline which attaches to a rough pump for decreasing the pressure in the load lock chamber 108 to the vacuum level of the transfer chamber 102. An advantage of a small load lock chamber, such as those shown in both FIG. 3 and FIG. 4, is that the pump can reduce the pressure very quickly, as fast as fifteen seconds, compared to four minutes for a multi-wafer load lock chamber.

In operation, when the load lock chamber 108 is ready to be serviced by the transfer chamber 102, the wafer lift apparatus positions the lower wafer seats 184 to receive a processed wafer. The opening 158 opens to permit access. A robot inserts the processed wafer into the middle of the load lock chamber 108. The wafer lift apparatus raises the processed wafer off of the robot. The robot withdraws from the load lock chamber 108. The wafer lift apparatus positions the upper wafer seats 182 to provide a heated wafer. The robot extends back into the load lock chamber 108. The wafer lift apparatus lowers the heated wafer onto the robot. The robot removes the heated wafer from the load lock chamber 108. The pressure in the load lock chamber 108 increases to the ambient environment pressure level. During this time, the wafer lift apparatus lowers the processed wafer to the wafer cooler, and the wafer cools for about thirty seconds or more, depending on the requirements of the primary process.

After the wafer cools and the pressure reaches the ambient level, the opening to the mini-environment 114 opens, and the wafer lift apparatus positions the upper wafer seats 182 to receive a new wafer. The mini-environment robot inserts the new wafer. The wafer lift apparatus raises the new wafer off of the robot. The robot withdraws from the load lock chamber 108. The wafer lift apparatus positions the lower wafer seats 184 to provide the cooled wafer. The robot reenters the load lock chamber 108. The wafer lift apparatus places the cooled wafer onto the robot. The robot removes the cooled wafer from the load lock chamber 108. The opening to the mini-environment closes, and the rough pump reduces the pressure to the vacuum level of the transfer chamber 102. During this time, the IR source turns on and radiates heat onto the new wafer for about twenty seconds or more, depending on the requirements of the primary process. The apparatus does not raise the new wafer closer to the wafer heater, because the IR sources radiate sufficiently to heat the wafer over the short distance shown, but the wafer may be raised away from the wafer cooler, so the wafer doesn't lose heat by conducting it to the wafer cooler. After the wafer is heated and the pressure reaches the right vacuum level, the opening 216 opens, and the procedure starts over.

Alternatively, the load lock chamber 108 may perform only one of the processes. In other words, it may only heat an incoming new wafer, or only cool an outgoing processed wafer, or only heat-treat an outgoing processed wafer.

In an alternative embodiment, the load lock chamber 108 may be vented with a suitable gas, such as helium, having a high thermal conductivity property, instead of with air. The wafer's heat conducts faster and faster to the surrounding gas as the density of the gas increases. By venting with a gas with relatively high thermal conductivity, the heat may be conducted away even more rapidly since the higher thermal conductivity improves the thermal coupling of the wafer to the cooling plate. The venting with helium may be done all the way to the ambient pressure, but it is preferred to vent only partially with the helium, such as to about 10 torr, and then complete the venting with air, since helium is more expensive than air, and since the thermal conductivity of air becomes sufficient to perform the cooling as the pressure approaches the ambient pressure.

Another advantage of a load lock chamber 108 that only holds a single wafer is that the wafer is accessible to a wafer orienter 202. A multi-wafer cassette does not provide the ability to have a wafer orienter in the load lock chamber, instead of in the mini-environment, because the wafer orienter would not have easy access to all of the wafers. With only one wafer in the load lock chamber, however, the wafer orienter 202 merely raises up and lifts the wafer in order to rotate it to orient it to the requirements of the primary process. Thus, there is no need for a wafer orienter in the mini-environment, so the transfer through the mini-environment to the load lock chambers is faster.

Yet another advantage of a vacuum processing system 100 described herein is that such a system reduces the amount of space required for the manufacturing facility. Since the load lock chambers 108 have a wafer heater and/or cooler, there is no need for separate cool-down and/or heating chambers, so the vacuum processing system 100 may have the maximum number of process chambers, thus increasing the throughput of each system 100 and reducing the total number of systems 100 needed in a manufacturing facility. Additionally, the small load lock chambers 108 provide additional space above or below the load lock chamber which may be used for a vacuum pump, a controller or other device to be located out of the way.

While the foregoing is directed to the preferred embodiment of the present invention, other and further embodiments of the invention may be devised without departing from the basic scope thereof, and the scope thereof is determined by the claims which follow.

What is claimed is:

1. A vacuum chamber for transitioning a wafer between a first pressure level and a second pressure level, the vacuum chamber comprising:
   an enclosure;
   a processing element disposed within the enclosure; and
   a lid assembly, comprising:
      a top plate;
      a lift actuator disposed on the top plate;
      at least two guide rods slidably disposed through the top plate and coupled to the lift actuator; and
      a wafer support connected to the at least two guide rods.

2. The vacuum chamber of claim 1 wherein
   the vacuum chamber is a load lock chamber adapted to transition a wafer between an ambient pressure and a vacuum pressure and perform one or more of a pre-processing and a post-processing wafer process.

3. The vacuum chamber of claim 2 wherein
   the processing element is a wafer heater and the chamber is configured to perform a pre-processing wafer process on the wafer.

4. The vacuum chamber of claim 2 wherein
   the processing element is a wafer heater and the chamber is configured to perform a post-processing wafer process on the wafer.

5. The vacuum chamber of claim 2 wherein
   the processing element is a wafer cooler and the chamber is configured to perform a post-processing wafer process on the wafer.

6. The vacuum chamber of claim 5 wherein the vacuum chamber is vented with a gas having a high thermal conductivity.

7. The vacuum chamber of claim 6 wherein the gas is helium.

8. The vacuum chamber of claim 1 wherein the wafer holder includes a maximum of two wafer supports for supporting a maximum of two wafers.

9. The vacuum chamber of claim 1 further comprising a wafer orienter disposed in the chamber.

10. A vacuum processing system comprising:
    a first vacuum chamber;
    a second vacuum chamber configured to perform a primary process on the wafer attached to the first vacuum chamber;
    a third vacuum chamber attached to the first vacuum chamber adapted to transition a wafer between an ambient pressure and a vacuum pressure and perform one or more of a pre-processing and a post-processing wafer process;
    a maximum of two wafer supports disposed within the third chamber; and
    a lid assembly disposed in the third chamber, comprising:
       a top plate;
       a lift actuator disposed on the top plate; and
       at least two guide rods slidably disposed through the top plate and coupled to the lift actuator; wherein the wafer supports are connected to the at least two guide rods.

11. The vacuum processing system of claim 9 further comprising
    a processing element disposed within the third chamber.

12. The vacuum processing system of claim 11 wherein the processing element performs a pre-processing wafer process on the wafer.

13. The vacuum processing system of claim 12 wherein the processing element is a wafer heater.

14. The vacuum processing system of claim 11 wherein the processing element performs a post-processing wafer process on the wafer.

15. The vacuum processing system of claim 14 wherein the processing element is a wafer heater.

16. The vacuum processing system of claim 14 wherein the processing element is a wafer cooler.

17. The vacuum processing system of claim 14 wherein the third chamber is vented with a gas having a high thermal conductivity.

18. The vacuum processing system of claim 17 wherein the gas is helium.

19. The vacuum processing system of claim 11 wherein the processing element performs the wafer process when the third chamber is transitioning the wafer from the first pressure level to the second pressure level.

20. The vacuum processing system of claim 11 wherein the processing element is disposed above the wafer support.

21. The vacuum processing system of claim 11 wherein the processing element is disposed below the wafer support.

22. The vacuum processing system of claim 11 further comprising a second processing element disposed within the third chamber.

23. The vacuum processing system of claim 22 wherein:
the processing element is disposed above a first wafer support; and
the second processing element is disposed below a second wafer support.

24. The vacuum processing system of claim 23 wherein the processing element comprises a wafer heater.

25. The vacuum processing system of claim 24 wherein the second processing element comprises a wafer cooler.

26. The vacuum processing system of claim 23 wherein the second processing element comprises a wafer cooler.

27. The vacuum processing system of claim 10 further comprising a wafer orienter disposed in the third chamber.

28. A vacuum chamber for transitioning a wafer between a first pressure level and a second pressure level, the vacuum chamber comprising:
an enclosure;
a first and second wafer holder;
a first processing element disposed above the first wafer holder;
a second processing element disposed below the second wafer holder; and
a lid assembly, comprising:
a top plate;
a lift actuator disposed on the top plate; and
at least two guide rods slidably disposed through the top plate and coupled to the lift actuator; wherein the first and second wafer holders are connected to the at least two guide rods.

29. The vacuum chamber of claim 28 wherein the first processing element comprises a wafer heater.

30. The vacuum chamber of claim 29 wherein the second processing element comprises a wafer cooler.

31. The vacuum chamber of claim 28 wherein the second processing element comprises a wafer cooler.

32. The vacuum chamber of claim 28 further comprising a wafer orienter disposed in the chamber.

33. A vacuum chamber for transitioning a wafer between a fist pressure level and a second pressure level, the vacuum chamber comprising:
an enclosure; and
a lid assembly, comprising:
a lift actuator;
a motion translation device connected to the lift actuator;
a housing coupled to the motion translation device;
a processing element disposed in the housing; and
a wafer holder disposed adjacent the processing element.

34. The vacuum chamber of claim 33 wherein the lift assembly further comprises a bellows assembly disposed at least partially around the lift actuator and the motion translation device.

35. The vacuum chamber of claim 34 further comprising a wafer orienter disposed in the chamber.

36. The vacuum chamber of claim 35 wherein the bellows assembly further comprises a flexible bellows and a mounting ring mounted to a top portion of a processing element housing.

37. The vacuum chamber of claim 35 further comprising a wafer cooler disposed in a bottom portion of the chamber.

38. The vacuum chamber of claim 37 wherein the wafer cooler has a coolant fluid channel disposed therein.

39. The vacuum chamber of claim 38 further comprising:
a second wafer holder; and
wherein the processing element comprises a wafer heater.

40. The vacuum chamber of claim 35 wherein the processing element comprises a wafer heater.

* * * * *

UNITED STATES PATENT AND TRADEMARK OFFICE
CERTIFICATE OF CORRECTION

PATENT NO.    : 6,270,582 B1
DATED         : August 7, 2001
INVENTOR(S)   : Rivkin et al.

It is certified that error appears in the above-identified patent and that said Letters Patent is hereby corrected as shown below:

Column 10,
Line 53, please replace "claim 9" with -- claim 10 --.

Column 11,
Line 24, please replace "claim 24" with -- claim 23 --.
Line 26, please replace "claim 23" with -- claim 24 --.

Column 12,
Line 5, please replace "claim 29" with -- claim 28 --.
Line 7, please replace "claim 28" with -- claim 29 --.

Signed and Sealed this

Thirteenth Day of August, 2002

*Attest:*

*Attesting Officer*

JAMES E. ROGAN
*Director of the United States Patent and Trademark Office*